United States Patent
Chen

(10) Patent No.: US 9,746,763 B2
(45) Date of Patent: Aug. 29, 2017

(54) PHASE SHIFT MASK AND METHOD OF FABRICATING THE SAME

(71) Applicant: Winbond Electronics Corp., Taichung (TW)

(72) Inventor: Kao-Tun Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 120 days.

(21) Appl. No.: 14/817,225

(22) Filed: Aug. 4, 2015

(65) Prior Publication Data

US 2016/0327855 A1    Nov. 10, 2016

(30) Foreign Application Priority Data

May 5, 2015    (CN) .......................... 2015 1 0222082

(51) Int. Cl.
G03F 1/26    (2012.01)
G03F 1/80    (2012.01)

(52) U.S. Cl.
CPC . *G03F 1/26* (2013.01); *G03F 1/80* (2013.01)

(58) Field of Classification Search
None
See application file for complete search history.

(56) References Cited

U.S. PATENT DOCUMENTS

2011/0294045 A1*  12/2011  Nagai .................... G03F 1/144
                                                                            430/5

FOREIGN PATENT DOCUMENTS

CN         101548238 A      9/2009

OTHER PUBLICATIONS

"Office Action of Taiwan Counterpart Application", dated on Jul. 21, 2016, p. 1-p. 6.

* cited by examiner

*Primary Examiner* — Stephen Rosasco
(74) *Attorney, Agent, or Firm* — Jianq Chyun IP Office

(57) ABSTRACT

Provided is a phase shift mask including a substrate, a phase shift layer, and a shielding layer. The phase shift layer is located on the substrate. A pattern of the phase shift layer includes a main pattern and sub-resolution assist features (SRAFs). The SRAFs are disposed around the main pattern. The phase shift layer has a transmission, and the transmission is larger than 6%. The shielding layer at least covers the SRAFs of the phase shift layer.

9 Claims, 3 Drawing Sheets

PHASE SHIFT MASK AND METHOD OF FABRICATING THE SAME

CROSS-REFERENCE TO RELATED APPLICATION

This application claims the priority benefit of Chinese application serial no. 201510222082.9, filed on May 5, 2015. The entirety of the above-mentioned patent application is hereby incorporated by reference herein and made a part of this specification.

BACKGROUND OF THE INVENTION

1. Field of the Invention

The invention relates to a mask and a method of fabricating the same, and particularly relates to a phase shift mask and a method of fabricating the same.

2. Description of Related Art

As the technology of semiconductor advances, the technical node of dynamic random access memory (DRAM) is further down-sized to 38 nanometers, and the critical dimension thereof is approaching the physical limitation of optical properties of machines for exposure. Thus, how to maximize the process window under the current conditions of exposure machines and mask has become an issue to work on.

SUMMARY OF THE INVENTION

The invention provides a phase shift mask having a high transmission and a method of fabricating the same capable of retaining a function of a sub-resolution assist feature (SRAF) and the sub-resolution assist feature is not imaged on a semiconductor substrate after exposure and development processes.

The invention provides a phase shift mask, including a substrate, a phase shift layer, and a shielding layer. The phase shift layer is located on the substrate. Patterns of the phase shift layer include a main pattern and a sub-resolution assist feature. The sub-resolution assist feature is disposed around the main pattern. The phase shift layer has a transmission, and the transmission is higher than 6%. The shielding layer at least covers the sub-resolution assist feature of the phase shift layer.

According to an embodiment of the invention, a line width of the sub-resolution assist feature is in a range from 10 nm to 30 nm.

According to an embodiment of the invention, the transmission of the phase shift layer is in a range from 18% to 30%.

According to an embodiment of the invention, the phase shift layer has a phase shift, and the phase shift is 180 degrees.

According to an embodiment of the invention, a material of the phase shift layer includes MoSi, TaSi, WSi, CrSi, NiSi, CoSi, ZrSi, NbSi, TiSi, or a combination thereof.

The invention provides a method of fabricating a phase shift mask, including steps as follows. A phase shift layer is formed on a substrate. Patterns of the phase shift layer include a main pattern and a sub-resolution assist feature. The sub-resolution assist feature is disposed around the main pattern. A shielding layer is formed on the phase shift layer. A mask layer is formed on the substrate. In addition, the mask layer at least covers the shielding layer on the sub-resolution assist feature. An etching process is performed, so as to remove a portion of the shielding layer and expose a surface of the phase shift layer not covered by the mask layer. The mask layer is removed.

According to an embodiment of the invention, the phase shift layer has a transmission, and the transmission is higher than 6%.

According to an embodiment of the invention, the transmission of the phase shift layer is in a range from 18% to 30%.

According to an embodiment of the invention, a material of mask layer includes a photoresist, an anti-reflection layer, or a combination thereof.

According to an embodiment of the invention, after exposure and development processes, the sub-resolution assist feature is not imaged on a semiconductor substrate.

According to the above, the shielding layer at least covers the sub-resolution assist feature of the phase shift layer in the invention, making the transmission of the sub-resolution assist feature of the invention close to zero and the phase shift close to zero degrees. In this way, the invention keeps the function (i.e., increasing the process window of the photolithography process) of the sub-resolution assist feature, and the sub-resolution assist feature is not imaged on the semiconductor substrate after the exposure and development processes.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
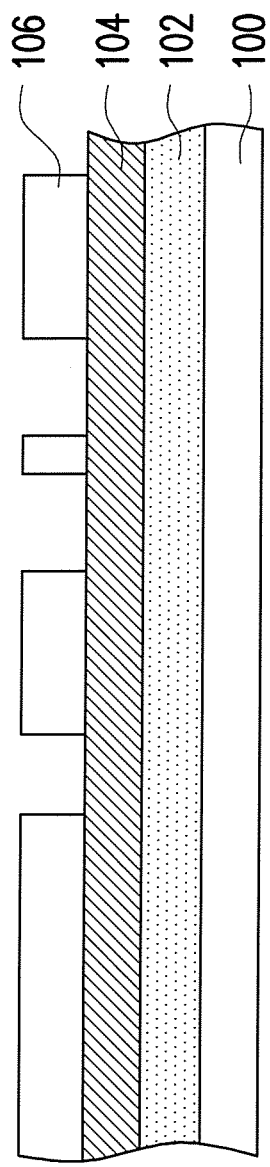
FIGS. 1A to 1F are schematic cross-sectional views illustrating a method of fabricating a phase shift mask according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are schematic cross-sectional views illustrating a method of fabricating a phase shift mask according to an embodiment of the invention.

Referring to FIG. 1A, the invention provides a method of fabricating a phase shift mask 10 with the following steps. A phase shift layer 102 and a shielding layer 104 are sequentially formed on a substrate 100. The substrate 100 may be a transparent substrate, for example. A material of the transparent substrate may be quartz glass, polymer, or other suitable transparent material. In this embodiment, a size of patterns of the phase shift mask 10 is four times of a size of patterns to be transferred. Thus, a distance, pattern, and size of the phase shift mask 10 in the following are four times of a distance, pattern, and size of the patterns to be transferred. However, the invention is not limited thereto. In other embodiments, the distance, pattern, and size of the phase shift mask 10 may also be enlarged by one time, five times, or ten times, etc.

The phase shift layer 102 has a transmission and a phase shift. The transmission of the phase shift layer 102 is higher than 6%, and the phase shift is 180 degrees. In other words, assuming that the substrate 100 is transparent, and incident light passes through the substrate 100 in transparent transmission with no phase shift generated, when the incident light passes through the phase shift layer 102 of the embodiment, more than 6% of the incident light may be transmitted and a phase shift of 180 degrees is provided. In this embodiment, the transmission may be in a range from 18% to 30%. A material of the phase shift layer 102 may be MoSi, TaSi, WSi, CrSi, NiSi, CoSi, ZrSi, NbSi, TiSi, or a combination thereof, for example, and a method of forming the phase shift layer 102 may include performing an electron beam (EB) evaporation process, laser evaporation process, atomic layer deposition process, or ion-assisted sputtering process, etc. In an embodiment, a thickness of the phase shift layer 102 is in a range from 40 nm to 100 nm, for example.

A material of the shielding layer 104 includes chrome (Cr) or chromium compounds (also referred to as "chrome group material" in the following). However, the invention is not limited thereto. A method of forming the shielding layer 104 includes performing a chemical vapor deposition process or a physical vapor deposition process, etc. In an embodiment, a thickness of the shielding layer 104 is in a range from 2 nm to 100 nm, for example.

Then, a patterned photoresist layer 106 is formed on the shielding layer 104. The patterned photoresist layer 106 may define patterns of the phase shift layer 102 formed in a subsequent process. The patterns of the phase shift layer 102 include a main pattern 102a and a sub-resolution assist feature 102b (as shown in FIG. 1C).

Figure 1B:
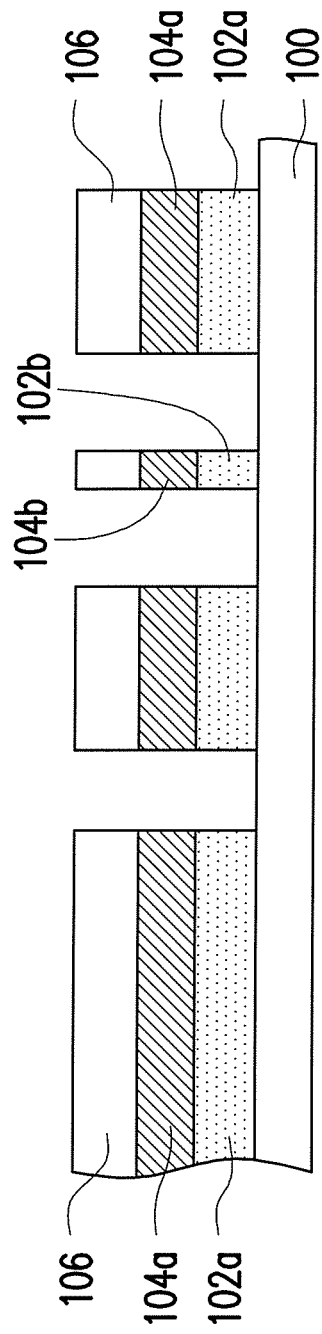

Referring to FIG. 1B, using the patterned photoresist layer 106 as a mask, an etching process is performed to remove a portion of the phase shift layer 102 and a portion of the shielding layer 104, so as to expose a surface of the substrate 100. The etching process may be a dry etching process or a wet etching process, for example. In an embodiment, when the material of the shielding layer 104 is a chrome group material, an aqueous solution of ceric ammonium nitrate and perchloric acid may be used to perform the etching process.

Figure 1C:
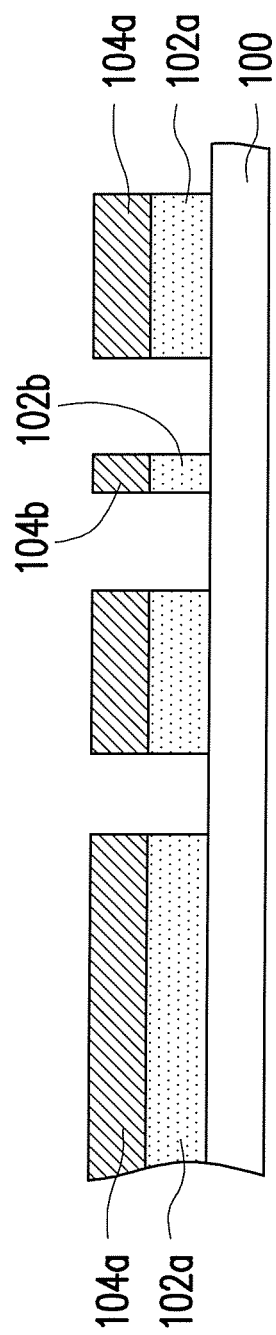

Then, referring to FIG. 1C, the patterned photoresist layer 106 is removed, so as to form patterned phase shift layers 102a and 102b and patterned shielding layers 104a and 104b on the substrate 100. In this embodiment, the patterned phase shift layer 102a may be considered as the main pattern (also referred to as the main pattern 102a in the following), and the patterned phase shift layer 102b may be considered as the sub-resolution assist feature (also referred to as the sub-resolution assist feature 102b in the following). The sub-resolution assist feature 102b is disposed around the main pattern 102a. The sub-resolution assist feature 102b refers to a pattern having an extremely small critical dimension. After an exposure process and a development process, the pattern is not imaged on the semiconductor substrate. In this embodiment, a line width of the sub-resolution assist feature 102b may be in a range from 10 nm to 30 nm. A line width of the main pattern 102a is in a range of three times to 20 times of the line width of the sub-resolution assist feature 102b. As shown in FIG. 1C, the shielding layer 104a covers the main pattern 102a, and the shielding layer 104b covers the sub-resolution assist feature 102b. Even though FIG. 1C only illustrates one sub-resolution assist feature 102b disposed between the main patterns 102a, the invention is not limited thereto. In other embodiments, the phase shift mask may also have a plurality of the sub-resolution assist features 102b respectively disposed around the main pattern 102a.

Figure 1D:
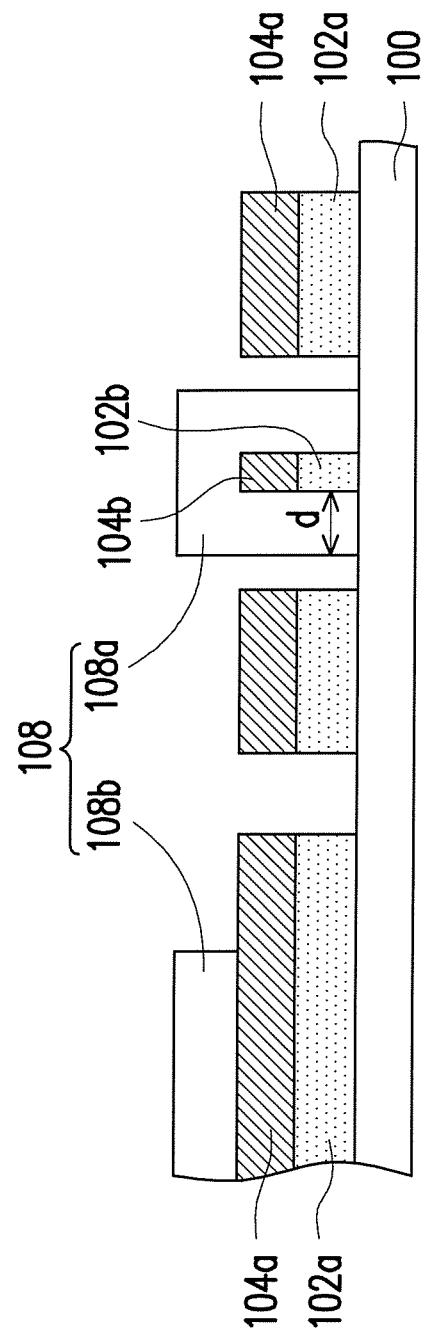

Referring to FIGS. 1C and 1D, a mask layer 108 is formed on the substrate 100. The mask layer 108 at least covers the sub-resolution assist feature 102b. More specifically, a mask layer 108a covers a top surface and side surfaces of the shielding layer 104b, side surfaces of the sub-resolution assist feature 102b, and a portion of the surface of the substrate 100, and a mask layer 108b covers a portion of a top surface of the shielding layer 104a. In this way, the mask layer 108a may protect the shielding layer 104b on the sub-resolution assist feature 102b, so as to prevent a subsequent etching process from removing the shielding layer 104b. In this embodiment, a material of the mask layer is a photoresist, an anti-reflection layer, or a combination thereof, for example. A distance d from a sidewall of the mask layer 108a to a sidewall of the sub-resolution assist feature 102b may be in a range from 15 nm to 35 nm.

Figure 1E:
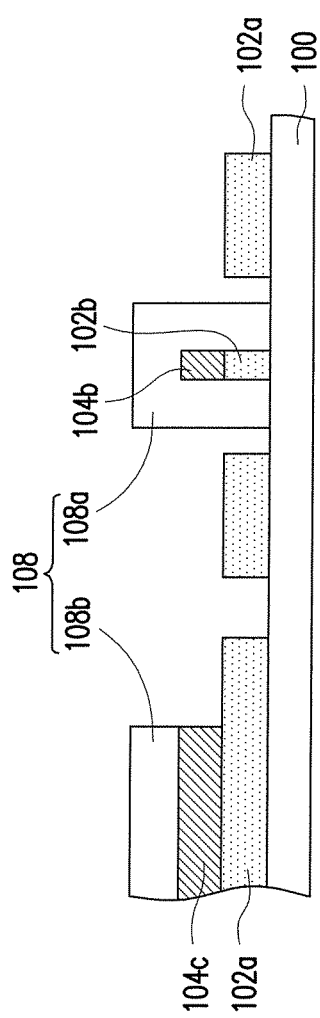
Figure 1F:
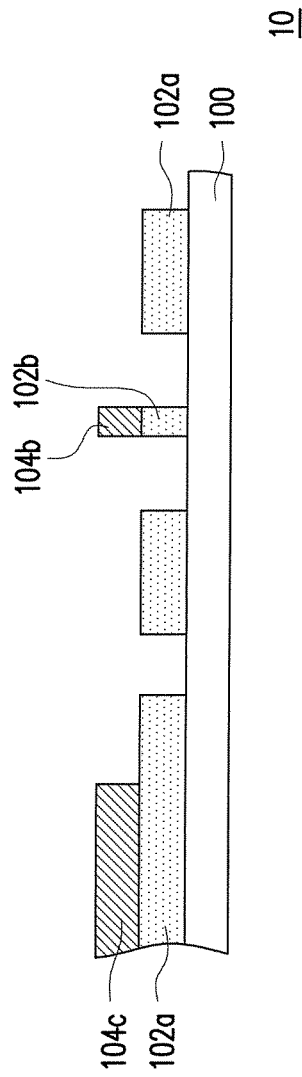

Referring to FIGS. 1E and 1F, using the mask layer 108 as a mask, an etching process is performed to remove a portion of the shielding layer 104a, so as to expose a portion of a surface of the main pattern 102a. The etching process may be a dry etching process or a wet etching process, for example. In an embodiment, when the material of the shielding layer 104a is a chrome group material, an aqueous solution of ceric ammonium nitrate and perchloric acid may be used to perform the etching process. Then, the mask layer 108 is removed, so as to form the phase shift mask 10 of this embodiment.

Referring to FIG. 1F, the phase shift mask 10 includes the substrate 100, the patterned phase shift layer 102a (i.e., the main pattern 102a), the patterned phase shift layer 102b (i.e., the sub-resolution assist feature 102b), and the shielding layers 104b and 104c. The patterned phase shift layers 102a and 102b are located on the substrate 100. Since the transmission of the patterned phase shift layer 102a is higher than 6%, and the phase shift thereof is 180 degrees, the phase shift mask 10 of this embodiment has preferable optical properties (as shown in Table 1 below). The shielding layer 104c covers a portion of the patterned phase shift layer 102a (also referred to as the main pattern 102a in the following), and the shielding layer 104b at least covers the patterned phase shift layer 102b (also referred to as the sub-resolution assist feature 102b). The sub-resolution assist feature 102b is disposed around the main pattern 102a, and is capable of increasing a process window of a photolithography process (as shown in Table 2 below). In addition, since the opaque shielding layer 104b of this embodiment at least covers the sub-resolution assist feature 102b, the sub-resolution assist feature 102b has a transmission close to zero, and a phase shift of the sub-resolution assist feature 102b is close to zero degrees. Thus, the incident light is unable to pass through the sub-resolution assist feature 102b, and does not generate any phase shift. Accordingly, after an exposure process and a development process, the sub-resolution assist feature 102b is not imaged on the semiconductor substrate (as shown in Table 2 and Table 3 in the following).

(Optical Simulation Experiment)

To provide proof to the practicality of the invention, examples are provided in the following to more specifically describe the invention. Even though the simulation experiment is described in the following, materials, proportions, details of processes, and procedure of the processes that are adopted may be suitably modified without exceeding the scope of the invention. Thus, no restrictive interpretation shall be made to the invention based on the following simulation experiment.

Referring to Table 1, compared with the conventional attenuated phase shift mask (attPSM) with a transmission of 6%, an attenuated phase shift mask with a transmission of 20% has a preferable performance in contrast, mask error enhancement factor (MEEF) and depth of focus (DOF, which may also be construed as the process window). Based on the same rationale, since the transmission of the patterned phase shift layer 102a of this embodiment is higher than 6%, the contrast, MEEF and DOF of the patterned phase shift layer 102a of the embodiment are more preferable than those of the attPSM with a transmission of 6%.

TABLE 1

|  | attPSM (transmission = 6%) | attPSM (transmission = 20%) |
|---|---|---|
| Pitch P (nm) | 90 | 90 |
| Width of mask unit block (nm) | 24 | 24 |
| Height of mask unit block (nm) | 44.5 | 40.5 |
| Contrast | 0.482 to 0.553 | 0.531 to 0.608 |
| MEEF | 3.21 | 3.05 |
| DOF (μm) | 0.21 | 0.23 |

Example 1

In Example 1, a shielding layer covers sub-resolution assist features (SRAFs) of a mask thereof, such that a transmission of the SRAFs of Example 1 is close to zero, and a phase shift thereof is close to zero degrees. Then, the mask of Example 1 is used in simulated exposure and development processes.

Comparative Example 1

In Comparative Example 1, SRAFs of a mask of Comparative Example 1 are not covered by a shielding layer, such that a transmission of the SRAFs of the Comparative Example 1 is approximately 20%, and a phase shift is approximately 180 degrees. Then, the mask of Comparative Example 1 is used in simulated exposure and development processes.

Comparative Example 2

A mask of Comparative Example 2 does not have SRAFs. Then, the mask of Comparative Example 2 is used in simulated exposure and development processes.

According to Table 2, it can be known that after the simulated exposure and development processes, the SRAFs of Comparative Example 1 are imaged on the semiconductor substrate, while the SRAFs of Example 1 are not imaged on the semiconductor substrate. Although Comparative Example 2 does not have the issue that the SRAFs are imaged on the semiconductor substrate, a DOF of Comparative Example 2 is smaller than a DOF of Example 1. In other words, a process window of Comparative Example 2 is smaller than a process window of Example 1.

TABLE 2

|  | Comparative Example 1 | Example 1 | Comparative Example 2 |
|---|---|---|---|
| SRAFs | transmission: 20%; phase shift: 180 degrees | transmission: 0%; phase shift: 0 degrees | NA |
| Development results of SRAFs | imaged | not imaged | not imaged |
| DOF (μm) | 0.1352 | 0.1236 | 0.0998 |
| Decay of DOF | 0% | 8.6% | 26.2% |

Example 2

In Example 2, a shielding layer covers SRAFs of a mask thereof, such that a transmission of the SRAFs of Example 2 is close to zero, a phase shift thereof is close to zero degrees, and a line width of the SRAFs of Example 2 is 20 nm. Then, the mask of Example 2 is used in simulated exposure and development processes with an optimal focus and a defocus of 0.06 respectively.

Comparative Example 3

In Comparative Example 3, SRAFs of a mask thereof are not covered by a shielding layer, so a transmission of the SRAFs of Comparative Example 3 is approximately 20%, a phase shift thereof is approximately 180 degrees, and a line width of the SRAFs of Comparative Example 3 is 16 nm. Then, the mask of Comparative Example 3 is used in simulated exposure and development processes with an optimal focus and a defocus of 0.06 μm, respectively.

According to Table 3, it can be known that after the exposure and development processes with the optimal focus, neither the SRAFs of Example 2 nor the SRAFs of Comparative Example 3 are imaged on the semiconductor substrate. However, after the exposure and development processes with the defocus of 0.06 μm (i.e., a state close to the actual exposure process), the SRAFs of Comparative Example 3 are imaged on the semiconductor substrate, while the SRAFs of Example 2 remain not imaged on the semiconductor substrate.

TABLE 3

|  | Example 2 | Comparative Example 3 |
|---|---|---|
| SRAFs | transmission: 0%; phase shift: 0 degrees; line width: 20 nm | transmission: 20%; phase shift: 180 degrees; line width: 16 nm |
| Development results of SRAFs (optimal focus) | not imaged | not imaged |
| Development results of SRAFs (defocus at 0.06 μm) | not imaged | imaged |

In view of the foregoing, the shielding layer at least covers the sub-resolution assist feature of the phase shift layer in the invention, making the transmission of the sub-resolution assist feature of the invention close to zero and the phase shift close to zero degrees. In this way, the invention keeps the function (i.e., increasing the process window of the photolithography process) of the sub-resolution assist feature, and the sub-resolution assist feature is not imaged on the semiconductor substrate after the exposure and development processes. Moreover, even if the exposure and development processes are performed in a defocus state (i.e., a state close to the actual exposure process), the sub-resolution assist feature of the invention is still not imaged on the semiconductor substrate. Moreover, since the transmission of the phase shift layer of the invention is higher than 6%, the contrast, mask error enhancement factor, and depth of focus of the phase shift mask of the embodiments of the invention are more preferable when compared with the conventional phase shift mask with a transmission of 6%.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase shift mask, comprising:
   a substrate;
   a phase shift layer, located on the substrate, wherein patterns of the phase shift layer comprise:
   a main pattern; and
   a sub-resolution assist feature, disposed around the main pattern, wherein the phase shift layer has a transmission, and the transmission is higher than 6%; and
   a shielding layer, at least covering the sub-resolution assist feature of the phase shift layer, wherein a line width of the sub-resolution assist feature is in a range from 10 nm to 30 nm.

2. The phase shift mask as claimed in claim 1, wherein the transmission of the phase shift layer is in a range from 18% to 30%.

3. The phase shift mask as claimed in claim 1, wherein the phase shift layer has a phase shift, and the phase shift is 180 degrees.

4. The phase shift mask as claimed in claim 1, wherein a material of the phase shift layer comprises MoSi, TaSi, WSi, CrSi, NiSi, CoSi, ZrSi, NbSi, TiSi, or a combination thereof.

5. A method of fabricating a phase shift mask, comprising:
   forming a phase shift layer on a substrate, wherein patterns of the phase shift layer comprise a main pattern and a sub-resolution assist feature, and the sub-resolution assist feature is disposed around the main pattern, wherein a line width of the sub-resolution assist feature is in a range from 10 nm to 30 nm;
   forming a shielding layer on the phase shift layer;
   forming a mask layer on the substrate, wherein the mask layer at least covers the shielding layer on the sub-resolution assist feature;
   performing an etching process to remove a portion of the shielding layer and expose a surface of the phase shift layer not covered by the mask layer; and
   removing the mask layer.

6. The method of fabricating the phase shift mask as claimed in claim 5, wherein the phase shift layer has a transmission, and the transmission is higher than 6%.

7. The method of fabricating the phase shift mask as claimed in claim 6, wherein the transmission of the phase shift layer is in a range from 18% to 30%.

8. The method of fabricating the phase shift mask as claimed in claim 5, wherein a material of mask layer comprises a photoresist, an anti-reflection layer, or a combination thereof.

9. The method of fabricating the phase shift mask as claimed in claim 5, wherein after exposure and development processes, the sub-resolution assist feature is not imaged on a semiconductor substrate.

* * * * *